United States Patent
Meyer et al.

(10) Patent No.: US 12,154,886 B2
(45) Date of Patent: Nov. 26, 2024

(54) SEMICONDUCTOR PACKAGES INCLUDING ELECTRICAL REDISTRIBUTION LAYERS OF DIFFERENT THICKNESSES AND METHODS FOR MANUFACTURING THEREOF

(71) Applicant: Infineon Technologies AG, Neubiberg (DE)

(72) Inventors: Thorsten Meyer, Regensburg (DE); Martin Gruber, Schwandorf (DE); Thorsten Scharf, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 491 days.

(21) Appl. No.: 17/502,163

(22) Filed: Oct. 15, 2021

(65) Prior Publication Data

US 2022/0157774 A1    May 19, 2022

(30) Foreign Application Priority Data

Nov. 19, 2020   (DE) ...................... 10 2020 130 617.2

(51) Int. Cl.
  *H01L 23/02*   (2006.01)
  *H01L 21/56*   (2006.01)
  *H01L 23/00*   (2006.01)

(52) U.S. Cl.
  CPC .............. *H01L 24/96* (2013.01); *H01L 21/56* (2013.01); *H01L 2224/04105* (2013.01); *H01L 2224/12105* (2013.01)

(58) Field of Classification Search
  CPC ............. H01L 23/3114; H01L 23/4951; H01L 2224/04105; H01L 2224/12105
  USPC .......................................................... 257/666
  See application file for complete search history.

(56) References Cited

U.S. PATENT DOCUMENTS

| | | | |
|---|---|---|---|
| 6,459,147 B1* | 10/2002 | Crowley ................. | H01L 24/40 257/730 |
| 6,479,888 B1* | 11/2002 | Hirashima .............. | H01L 24/81 257/676 |
| 6,545,364 B2* | 4/2003 | Sakamoto ........... | H01L 21/4832 257/E23.044 |
| 2002/0027276 A1 | 3/2002 | Sakamoto et al. | |
| 2008/0087913 A1* | 4/2008 | Otremba ................. | H01L 24/40 438/123 |
| 2008/0157340 A1 | 7/2008 | Yang et al. | |
| 2009/0194854 A1 | 8/2009 | Tan et al. | |

(Continued)

*Primary Examiner* — Nitin Parekh
(74) *Attorney, Agent, or Firm* — Dicke, Billig & Czaja, PLLC

(57) ABSTRACT

A semiconductor package is disclosed. In one example, the package includes a non-power chip including a first electrical contact arranged at a first main surface of the non-power chip. The semiconductor package further includes a power chip comprising a second electrical contact arranged at a second main surface of the power chip. A first electrical redistribution layer coupled to the first electrical contact and a second electrical redistribution layer coupled to the second electrical contact. When measured in a first direction vertical to at least one of the first main surface or the second main surface, a maximum thickness of at least a section of the first electrical redistribution layer is smaller than a maximum thickness of the second electrical redistribution layer.

9 Claims, 7 Drawing Sheets

(56) References Cited

U.S. PATENT DOCUMENTS

| | | |
|---|---|---|
| 2011/0108971 A1* | 5/2011 | Ewe ................. H01L 24/83 |
| | | 438/109 |
| 2012/0049388 A1 | 3/2012 | Pagaila |
| 2013/0020694 A1* | 1/2013 | Liang ............... H01L 23/473 |
| | | 257/691 |
| 2013/0113090 A1* | 5/2013 | Atsumi ............ H01L 23/49568 |
| | | 257/676 |
| 2014/0035112 A1* | 2/2014 | Kadoguchi ....... H01L 23/49575 |
| | | 438/123 |
| 2014/0264337 A1 | 9/2014 | Chen et al. |
| 2014/0264804 A1* | 9/2014 | Terrill .............. H01L 24/36 |
| | | 257/676 |
| 2016/0027711 A1* | 1/2016 | Harada ............ H01L 23/49827 |
| | | 257/698 |
| 2016/0093597 A1 | 3/2016 | Chang et al. |
| 2016/0197029 A1 | 7/2016 | Tsai et al. |
| 2018/0130783 A1 | 5/2018 | Tuominen et al. |
| 2018/0130732 A1 | 10/2018 | Tuominen et al. |

\* cited by examiner

SEMICONDUCTOR PACKAGES INCLUDING ELECTRICAL REDISTRIBUTION LAYERS OF DIFFERENT THICKNESSES AND METHODS FOR MANUFACTURING THEREOF

CROSS-REFERENCE TO RELATED APPLICATION

This Utility Patent Application claims priority to German Patent Application No. 10 2020 130 617.2, filed Nov. 19, 2020, which is incorporated herein by reference.

BACKGROUND

Technical Field

The present disclosure relates to semiconductor packages including electrical redistribution layers of different thicknesses. In addition, the present disclosure relates to methods for manufacturing such semiconductor packages.

Semiconductor packages may include semiconductor chips of different types, such as e.g. logic chips and power chips. Techniques for integrating different types of semiconductor chips in a package may need to consider the specific properties of the respective chip types. For example, logic chips may require small contacts, short interconnects and low currents, while power chips may require thick metals for high currents and a small number of interconnects. Manufacturers of semiconductor packages are constantly striving to improve their products and methods for manufacturing thereof. It may be desirable to develop semiconductor packages accounting for the above mentioned chip requirements, thereby providing an improved electrical and thermal performance compared to standard semiconductor packages. In addition, it may be desirable to provide effective methods for manufacturing such semiconductor packages.

SUMMARY

An aspect of the present disclosure relates to a semiconductor package. The semiconductor package comprises a non-power chip comprising a first electrical contact arranged at a first main surface of the non-power chip. The semiconductor package further comprises a power chip comprising a second electrical contact arranged at a second main surface of the power chip. The semiconductor package further comprises a first electrical redistribution layer, wherein the first electrical redistribution layer is configured to provide an electrical coupling between the first electrical contact and a first external electrical contact of the semiconductor package. The semiconductor package further comprises a second electrical redistribution layer, wherein the second electrical redistribution layer is configured to provide an electrical coupling between the second electrical contact and a second external electrical contact of the semiconductor package. The second electrical redistribution layer comprises one of: a lead of a leadframe, a pedestal of a structured metal sheet, a conductive post. When measured in a first direction vertical to at least one of the first main surface or the second main surface, a maximum thickness of at least a section of the first electrical redistribution layer is smaller than a maximum thickness of the second electrical redistribution layer.

An aspect of the present disclosure relates to a method for manufacturing a semiconductor package. The method comprises providing a non-power chip comprising a first electrical contact arranged at a first main surface of the non-power chip. The method further comprises providing a power chip comprising a second electrical contact arranged at a second main surface of the power chip. The method further comprises forming a first electrical redistribution layer, wherein the first electrical redistribution layer is configured to provide an electrical coupling between the first electrical contact and a first external electrical contact of the semiconductor package. The method further comprises forming a second electrical redistribution layer, wherein the second electrical redistribution layer is configured to provide an electrical coupling between the second electrical contact and a second external electrical contact of the semiconductor package. When measured in a first direction vertical to at least one of the first main surface or the second main surface, a maximum thickness of at least a section of the first electrical redistribution layer is smaller than a maximum thickness of the second electrical redistribution layer. Providing the non-power chip and providing the power chip comprises: providing a carrier, arranging the non-power chip and the power chip over the carrier, encapsulating the non-power chip and the power chip in an encapsulation material, and removing the carrier, wherein the first main surface, the second main surface and a main surface of the encapsulation material form a common planar surface.

An aspect of the present disclosure relates to a method for manufacturing a semiconductor package. The method comprises providing a non-power chip comprising a first electrical contact arranged at a first main surface of the non-power chip. The method further comprises providing a power chip comprising a second electrical contact arranged at a second main surface of the power chip. The method further comprises forming a first electrical redistribution layer, wherein the first electrical redistribution layer is configured to provide an electrical coupling between the first electrical contact and a first external electrical contact of the semiconductor package. The method further comprises forming a second electrical redistribution layer, wherein the second electrical redistribution layer is configured to provide an electrical coupling between the second electrical contact and a second external electrical contact of the semiconductor package. When measured in a first direction vertical to at least one of the first main surface or the second main surface, a maximum thickness of at least a section of the first electrical redistribution layer is smaller than a maximum thickness of the second electrical redistribution layer. The method further comprises providing a metal sheet having a first main surface and a second main surface opposite to the first main surface, wherein forming the second electrical redistribution layer comprises subtractively structuring the first main surface of the metal sheet.

An aspect of the present disclosure relates to a method for manufacturing a semiconductor package. The method comprises providing a non-power chip comprising a first electrical contact arranged at a first main surface of the non-power chip. The method further comprises providing a power chip comprising a second electrical contact arranged at a second main surface of the power chip. The method further comprises forming a first electrical redistribution layer, wherein the first electrical redistribution layer is configured to provide an electrical coupling between the first electrical contact and a first external electrical contact of the semiconductor package. The method further comprises forming a second electrical redistribution layer, wherein the second electrical redistribution layer is configured to provide an electrical coupling between the second electrical contact and a second external electrical contact of the semiconductor package. When measured in a first direction vertical to at least one of the first main surface or the second main surface, a maximum thickness of at least a section of the first electrical redistribution layer is smaller than a maximum thickness of the second electrical redistribution layer. The method further comprises providing a carrier comprising a metal coating, wherein forming the first electrical redistribution layer and the second electrical redistribution layer comprises subtractively structuring the metal coating.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure.

Figure 1:
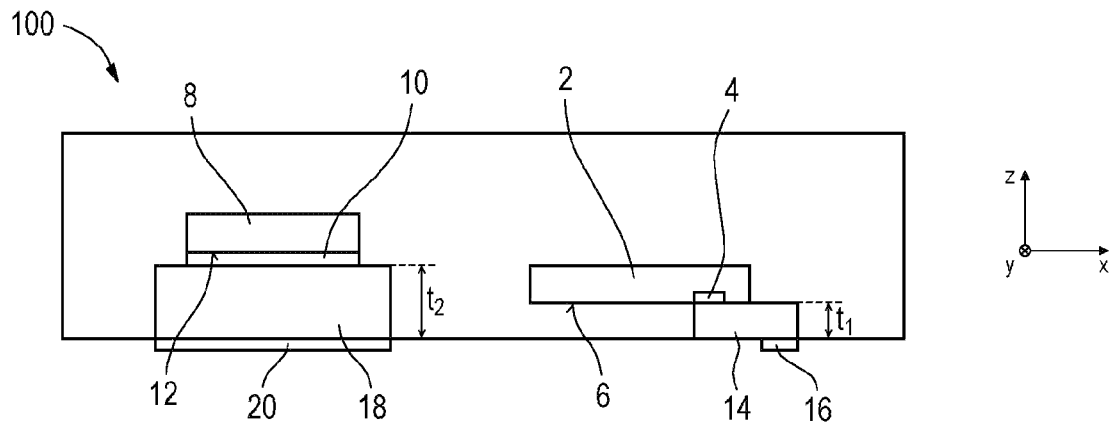
FIG. 1 schematically illustrates a cross-sectional side view of a semiconductor package 100 in accordance with the disclosure.

The semiconductor package 100 of FIG. 1 is illustrated in a general manner in order to qualitatively specify aspects of the disclosure. The semiconductor package 100 may include further aspects which are not illustrated for the sake of simplicity. For example, the semiconductor package 100 may be extended by any of the aspects described in connection with other semiconductor packages and methods in accordance with the disclosure.

The semiconductor package 100 may include a non-power chip 2 including a first electrical contact 4 arranged at a first main surface 6 of the non-power chip 2 as well as a power chip 8 including a second electrical contact 10 arranged at a second main surface 12 of the power chip 8. The semiconductor package 100 may further include a first electrical redistribution layer 14 configured to provide an electrical coupling between the first electrical contact 4 of the non-power chip 2 and a first external electrical contact 16 of the semiconductor package 100 as well as a second electrical redistribution layer 18 configured to provide an electrical coupling between the second electrical contact 10 of the power chip 8 and a second external electrical contact 20 of the semiconductor package 100. When viewed in a first direction vertical to at least one of the first main surface 6 or the second main surface 12 (e.g. in the z-direction), a maximum thickness $t_1$ of at least a section of the first electrical redistribution layer 14 may be smaller than a maximum thickness $t_2$ of the second electrical redistribution layer 18.

It is noted that throughout this description, the terms "chip", "semiconductor chip", "die", "semiconductor die" may be used interchangeably. In general, the semiconductor chips described herein may be manufactured from an elemental semiconductor material (e.g. Si) or from a wide band gap semiconductor material or a compound semiconductor material (e.g. SiC, GaN, SiGe, GaAs).

The power chip 8 may include a power semiconductor component. Power chips may be used in any kind of power application like e.g. MOSFETs (Metal Oxide Semiconductor Field Effect Transistors), half bridge circuits, power modules including a gate driver, etc. For example, power chips may include or may be part of a power device like e.g. a power MOSFET, an LV (low voltage) power MOSFET, a power IGBT (Insulated Gate Bipolar Transistor), a power diode, a superjunction power MOSFET, etc. In one example, a power semiconductor component may be used as a switch or a rectifier in power electronics. Such component may be called a power component or, when used in an integrated circuit, a power integrated circuit. A power semiconductor element may e.g. have a supply voltage of more than about 20V. Power chips may require thick metals (e.g. clips) for carrying high currents, a low number of interconnects, good isolation properties and thermal treatment. Oftentimes, electrical contacts of power chips may be electrically contacted via electrically conductive clips.

The non-power chip 2 may be any kind of semiconductor chip which may not be considered a power chip. For example, the non-power chip 2 may include at least one of a sensor chip, a logic chip, a memory chip, etc. A sensor chip may be configured to sense a physical variable, for example pressure, temperature, humidity, accelerations, etc. In one example, a sensor chip may be a MEMS (Micro-Electro-Mechanical System) chip including a MEMS structure which may be integrated in the chip. A logic chip may be configured to process electrical signals provided by other electronic components of the sensor package 100. For example, the logic chip may include an application specific integrated circuit (ASIC). Additionally or alternatively, a logic chip may be configured to control and/or drive other electronic components of the semiconductor package 100. In one example, a logic chip may be configured to control and/or drive integrated circuits of the power chip 8.

The maximum thickness $t_1$ of the first electrical redistribution layer 14 may be in a range from about 2 micrometer to about 40 micrometer, more particular from about 2 micrometer to about 30 micrometer, more particular from about 2 micrometer to about 20 micrometer, and even more particular from about 2 micrometer to about 10 micrometer. The maximum thickness $t_2$ of the second electrical redistribution layer 18 may be in a range from about 150 micrometer to about 2000 micrometer, more particular from about 150 micrometer to about 1500 micrometer, more particular from about 150 micrometer to about 1000 micrometer, and even more particular from about 150 micrometer to about 500 micrometer.

The external electrical contacts 16 and 20 may be arranged at one or more peripheral surfaces of the semiconductor package 100. In the example of FIG. 1, the first external electrical contact 16 and the second external electrical contact 20 may both be arranged at a same peripheral surface of the semiconductor package 100. One or more of the external electrical contacts 16 and 20 may be configured to electrically and mechanically couple the semiconductor package 100 to an external component, such as e.g. a printed circuit board (not illustrated). An external electrical contact of the semiconductor package 100 may include at least one of a solder ball, a solder depot, an electrically conductive pillar, an electrically conductive pad, a landing pad, etc.

While the non-power chip 2 and the power chip 8 may be integrated in the same semiconductor package 100, the electrical distribution layers 14 and 18 may differ in their thicknesses and further characteristics. As will become more apparent in further examples described below, different manufacturing methods and different designs for the electrical redistribution layers 14 and 18 may take into account the specific technical properties of the chips 2 and 8 of different types.

The power chip 8 may require a high current carrying capability, a good thermal path and interconnection at both sides in case of a vertical current flow. On the other hand, interconnect pitches of the power chip 8 may be fairly rough with no need for tight line spaces. For example, these requirements of the power chip 8 may be addressed by the second electrical redistribution layer 18 having a comparatively large thickness $t_2$. As will become apparent later on, the requirements may e.g. be addressed by providing thick metallization blocks and a clip design for electrical contacts (e.g. source and drain) of the power chip 8.

The non-power chip 2 may require tight lines and tight spaces in the first electrical redistribution layer 14. In addition, the non-power chip 2 may require tight pad pitches and a relatively high number of connections inside the package (e.g. between different chips) and to the outside. These requirements cannot necessarily be achieved with thick redistribution lines as required for the power chip 8. The requirements of the non-power chip 2 may be addressed by providing a comparatively thin first redistribution layer 14 based on additive, semi-additive or subtractive process technologies.

Figure 2:
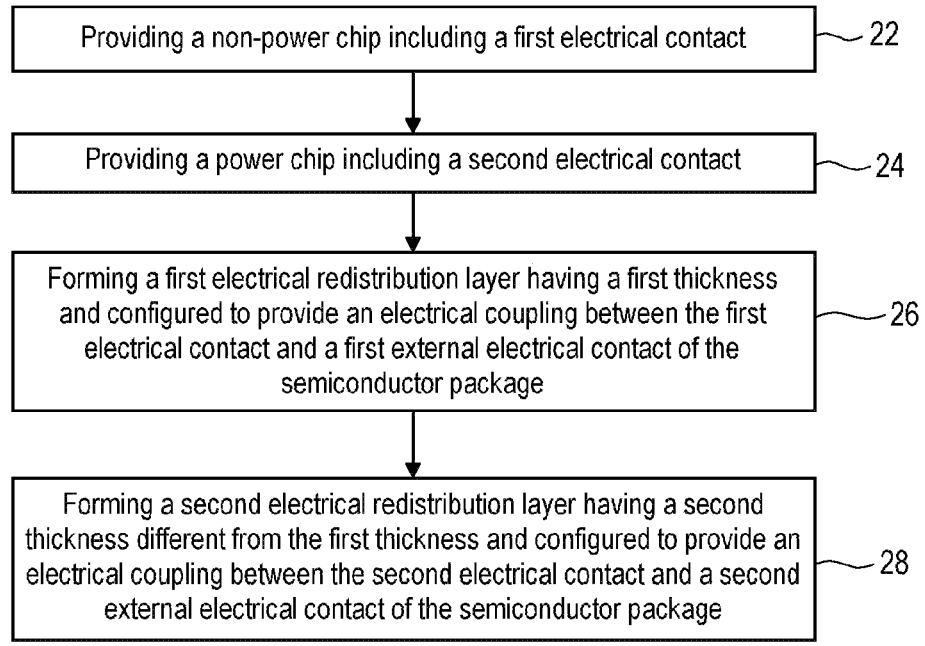
FIG. 2 illustrates a flowchart of a method for manufacturing a semiconductor package in accordance with the disclosure.

FIG. 2 illustrates a flowchart of a method for manufacturing a semiconductor package in accordance with the disclosure. For example, the method of FIG. 2 may be used for manufacturing the semiconductor package 100 of FIG. 1. The method of FIG. 2 is described in a general manner in order to qualitatively specify aspects of the disclosure and may include further aspects. For example, the method of FIG. 2 may be extended by any of the aspects described in connection with other examples in accordance with the disclosure.

At 22, a non-power chip including a first electrical contact arranged at a first main surface of the non-power chip may be provided. At 24, a power chip including a second electrical contact arranged at a second main surface of the power chip may be provided. At 26, a first electrical redistribution layer may be formed, wherein the first electrical redistribution layer may be configured to provide an electrical coupling between the first electrical contact and a first external electrical contact of the semiconductor package. At 28, a second electrical redistribution layer may be formed, wherein the second electrical redistribution layer may be configured to provide an electrical coupling between the second electrical contact and a second external electrical contact of the semiconductor package. When measured in a first direction vertical to at least one of the first main surface or the second main surface, a maximum thickness of at least a section of the first electrical redistribution layer may be smaller than a maximum thickness of the second electrical redistribution layer.

The methods described in connection with following FIGS. 3 to 6 may be seen as more detailed versions of the method of FIG. 2. Comments made in connection with FIGS. 3 to 6 may thus also apply to the previously described examples of FIGS. 1 and 2. The order of the individual method acts discussed in connection with FIGS. 3 to 6 is exemplary and non-limiting. The acts of a method may be exchanged, if reasonable and possible from a technical point of view. Furthermore, it is to be noted that each of the following methods may be performed as a batch process. That is, the individual method acts may be performed for an arbitrary number of similar arrangements.

Figure 3A:
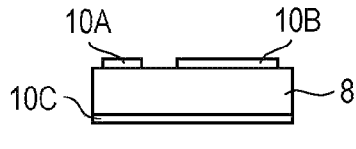
FIG. 3 includes FIGS. 3A to 3J schematically illustrating a cross-sectional side view of a method for manufacturing a semiconductor package 300 in accordance with the disclosure.
Figure 3A:
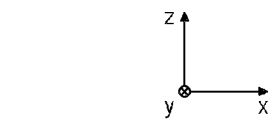
Figure 3B:
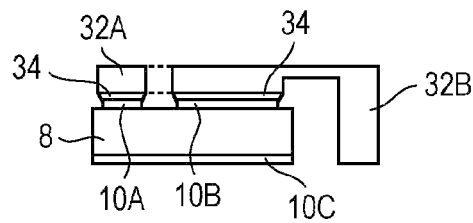
Figure 3B:
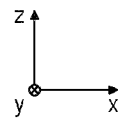
Figure 3C:
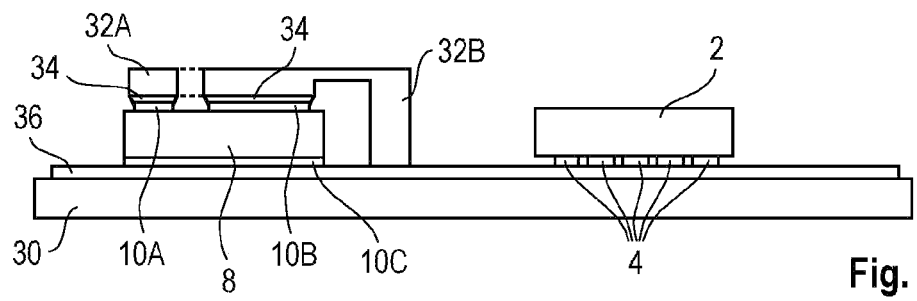
Figure 3C:
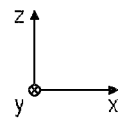
Figure 3D:
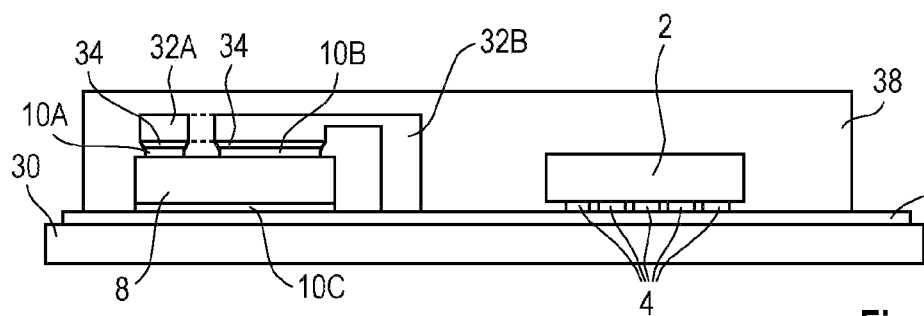
Figure 3D:
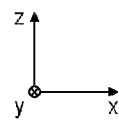
Figure 3E:
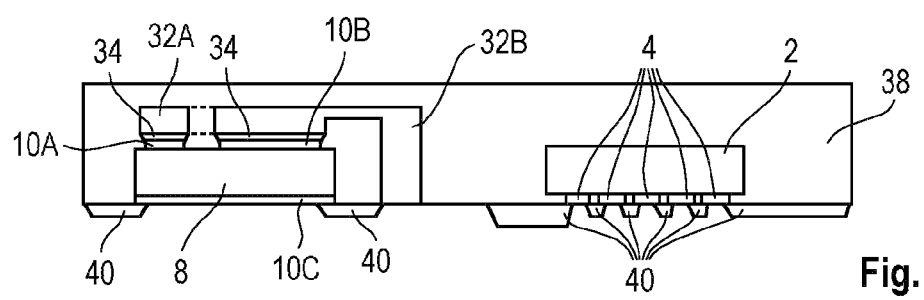
Figure 3E:
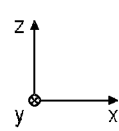
Figure 3F:
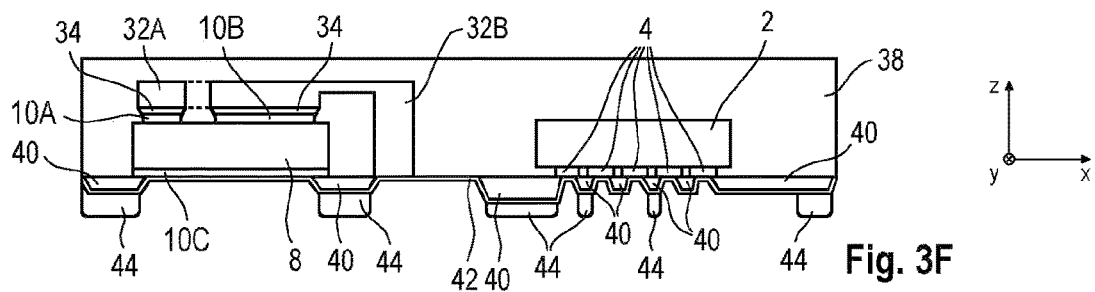
Figure 3G:
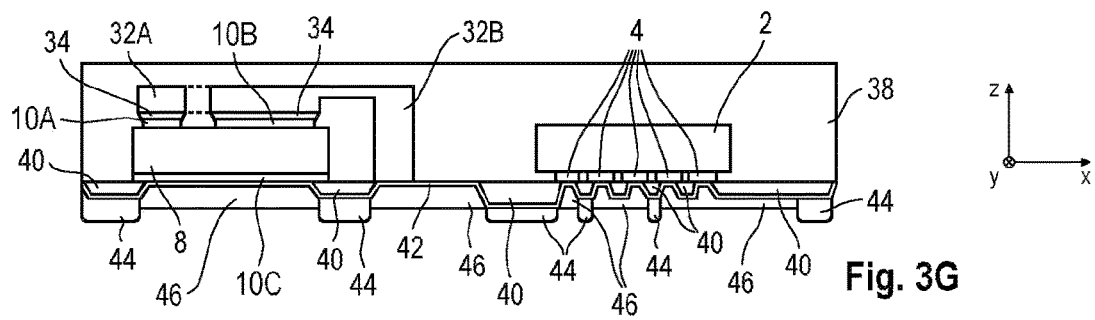
Figure 3H:
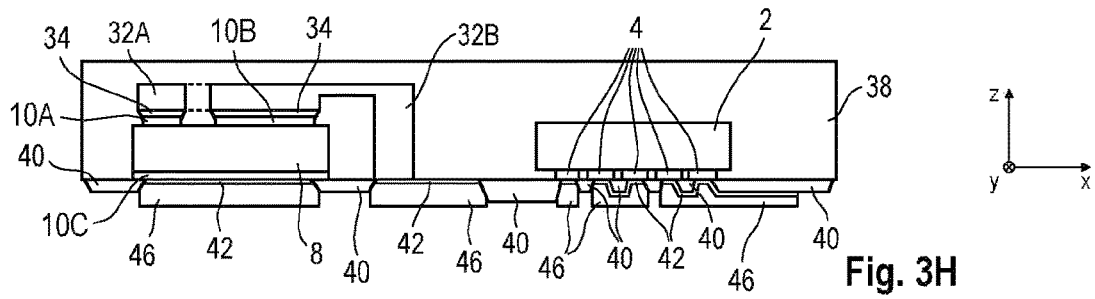
Figure 3I:
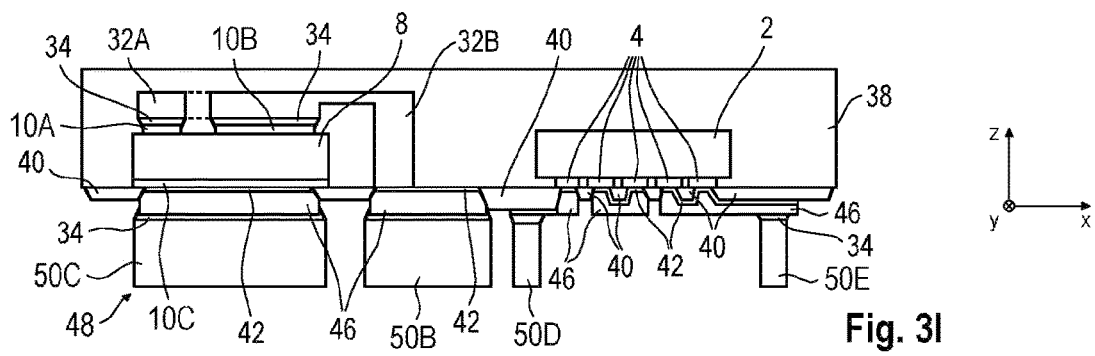
Figure 3J:
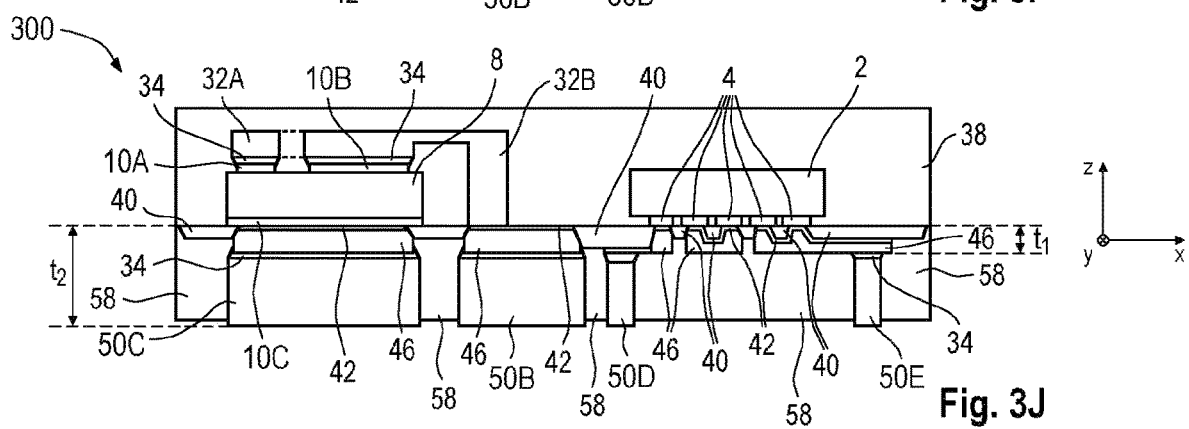

FIG. 3 includes FIGS. 3A to 3J illustrating a method for manufacturing a semiconductor package 300 which is shown in FIG. 3J. In FIG. 3A, a power chip 8 may be provided. The power chip 8 may include a first electrical contact 10A and a second electrical contact 10B arranged on the top surface of the power chip 8 as well as a third electrical contact 10C arranged on the bottom surface of the power chip 8. In the example of FIG. 3A, the power chip 8 may include or may correspond to a power transistor, such as e.g. a power MOSFET. In this case, the first electrical contact 10A may be a gate contact of the power transistor, the second electrical contact 10B may be a source contact of the power transistor, and the third electrical contact 10C may be a drain contact of the power transistor. The power chip 8 may have a vertical structure. That is, the power chip 8 may be manufactured such that electric currents may substantially flow in a direction perpendicular to the main faces of the power chip 8, i.e. in the z-direction. Further examples for a vertical power chip are a power HEMT, a PMOS (P-Channel Metal Oxide semiconductor), an NMOS (N-Channel Metal Oxide semiconductor), etc. In further examples, the power chip 8 may have a lateral structure. That is, the power chip 8 may be manufactured such that electric currents may substantially flow in the x-y-plane.

In FIG. 3B, the electrical contacts 10A and 10B of the power chip 8 may be electrically coupled to electrical contact elements 32A and 32B, respectively. The electrical connection may be provided by means of a connection material 34 based on at least one of soldering, sintering, diffusion soldering, reflow soldering, etc. In the example of FIG. 3B, the electrical contact elements 32A, 32B may include or may correspond to electrically conductive clips which may be made of at least one of a metal or a metal alloy. Alternatively, the electrical contact element 32A connected to the gate contact of the power chip 8 may include a wire.

In FIG. 3C, a carrier 30 may be provided. An adhesive layer 36 may be arranged over the top surface of the carrier 36. For example, the adhesive layer 36 may include an adhesive foil or an adhesive tape, such as e.g. a Revalpha tape. The power chip 8 including the electrical contact elements 32A and 32B may be arranged on the carrier 30. In addition, a non-power chip 2 may be placed on the top surface of the carrier 30. The non-power chip 2 may have a lateral structure, i.e. an operation of the non-power chip 2 may be based on a lateral current flow. The non-power chip 2 may include one or multiple electric contacts 4 which may be arranged on the bottom surface of the non-power chip 2. In the example of FIG. 3C, the electrical contacts 4 may include at least one of copper pillars or electrically conductive contact pads.

In FIG. 3D, the non-power chip 2 and the power chip 8 may be encapsulated by an encapsulation material 38. The encapsulation material 38 may include at least one of a laminate, an epoxy, a filled epoxy, a glass fiber filled epoxy, an imide, a thermoplast, a thermoset polymer, a polymer blend, etc. Various techniques may be used for encapsulating the components arranged on the carrier 30 with the encapsulation material 38, for example at least one of compression molding, injection molding, powder molding, liquid molding, map molding, laminating, etc.

In FIG. 3E, the carrier 30 and the adhesive layer 36 may be released and removed. The bottom surfaces of the non-power chip 2, the power chip 8 and the encapsulation material 38 may be coplanar and form a common planar surface. A dielectric material 40 may be arranged over the common planar surface. The dielectric material 40 may be structured such that the electrical contacts 4 and 10C of the chips 2 and 8 may be uncovered by the dielectric material 40. For example, the dielectric material 40 may be structured based on a photolithographic process.

In FIG. 3F, a seed layer 42 may be arranged over the bottom surface of the arrangement, for example by means of a sputtering act. The seed layer 42 may e.g. include at least one of titanium tungsten (TiW) or copper. In particular, the seed layer 42 may substantially cover the entire bottom surface of the arrangement. In addition, a structured plating resist 44 may be arranged over portions of the seed layer 42. In one example, the plating resist 44 may be first deposited over the entire bottom surface of the arrangement and structured afterwards. Here, the plating resist 44 may be partly removed such that the seed layer 42 may be uncovered from the plating resist 44 at positions of the electrical contacts 4 and 10.

In FIG. 3G, a metal layer 46 may be arranged at the positions of the uncovered seed layer 44, for example based on an electroplating technique. In one example, the metal layer 46 may include only one layer of e.g. copper. In a further example, the metal layer 46 may include multiple metal layers forming a metal stack. A thickness of the metal layer 46 in the z-direction may be in a range from about 3 micrometers to about 12 micrometer, more particular from about 5 micrometer to about 10 micrometer. First parts of the metal layer 46 on the left may be electrically coupled to the electrical contacts 10 of the power chip 8 while second parts of the metal layer 46 on the right may be electrically coupled to the electrical contacts 4 of the non-power chip 2.

In FIG. 3H, the plating resist 44 may be released and removed.

In FIG. 3I, a leadframe 48 (e.g. half-etched) including one or multiple diepads as well as one or multiple leads (or pins) 50 may be electrically coupled to the first and second parts of the metal layer 46. For example, such electrical connection may be established by at least one of soldering, gluing, sintering, diffusion soldering, etc. In this regard, a connection material 34 may be formed between the leadframe 48 and the metal layer 46. It is to be noted that the number of leads 50 shown in FIG. 3I is exemplary and may particularly depend on the specific type of semiconductor package that is to be manufactured.

In the example of FIG. 3I, a first lead (not visible due to the chosen perspective) may be connected to the gate contact 10A of the power chip 8 via the metal layer 36 and the clip 32A. In addition, a second lead 50B may be connected to the source contact 10B of the power chip 8 via the metal layer 36 and the clip 32B, and a third lead 50C may be connected to the drain contact 10C of the power chip 8 via the metal layer 36. Furthermore, a fourth lead 50D and a fifth lead 50E may be connected to electrical contacts 4 of the non-power chip 2, respectively.

In FIG. 3J, gaps between the leads 50 of the leadframe 48 may be filled with an electrically insulating filler material 58, wherein a substantially planar bottom surface of the arrangement may be formed. In one example, the gaps may be filled with a mold material which may be grinded from its backside afterwards. In a further example, the arrangement of FIG. 3I may be arranged on a carrier (not illustrated) with a release foil (not illustrated) and a molding process may be performed. Afterwards, the carrier and the release foil may be removed.

The method of FIG. 3 may correspond to a batch process. In a further act (not illustrated), the arrangement may be separated into multiple semiconductor packages 300. The semiconductor package 300 of FIG. 3J may be seen as a more detailed version of the semiconductor package 100 of FIG. 1.

The leads 50 of the leadframe 48 may form external electrical contacts of the semiconductor package to be manufactured. Referring back to FIG. 1, the leads 50 of FIG. 3J may correspond to the external electrical contacts 16 and 20 of FIG. 1. The leads 50 and the parts of the metal layer 46 electrically connected to the non-power chip 2 may form a first electrical redistribution layer. The first electrical redistribution layer may be configured to carry electrical currents in the z-direction and in the x-y-plane. At least a section of the first electrical redistribution layer may have a maximum thickness $t_1$ as discussed in connection with FIG. 1. In the example of FIG. 3J, the section may be arranged in a footprint of the non-power chip 2 when viewed in the z-direction.

In a similar fashion, the leads 50 and the parts of the metal layer 46 electrically connected to the power chip 8 may form a second electrical redistribution layer having a maximum thickness $t_2$. The second electrical redistribution layer may be configured to carry electrical currents in the z-direction. In particular, the second electrical redistribution layer may be configured to carry electrical currents exclusively in the z-direction.

Figure 4A:
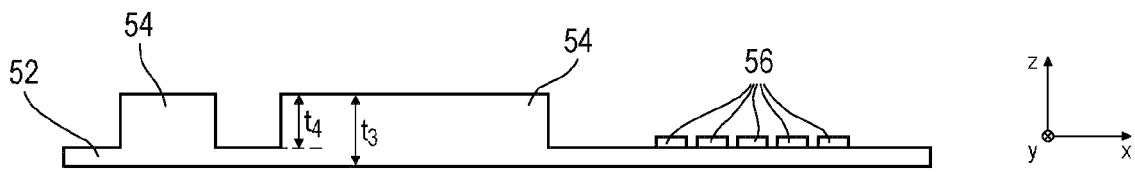
FIG. 4 includes FIGS. 4A to 4E schematically illustrating a cross-sectional side view of a method for manufacturing a semiconductor package 400 in accordance with the disclosure.
Figure 4B:
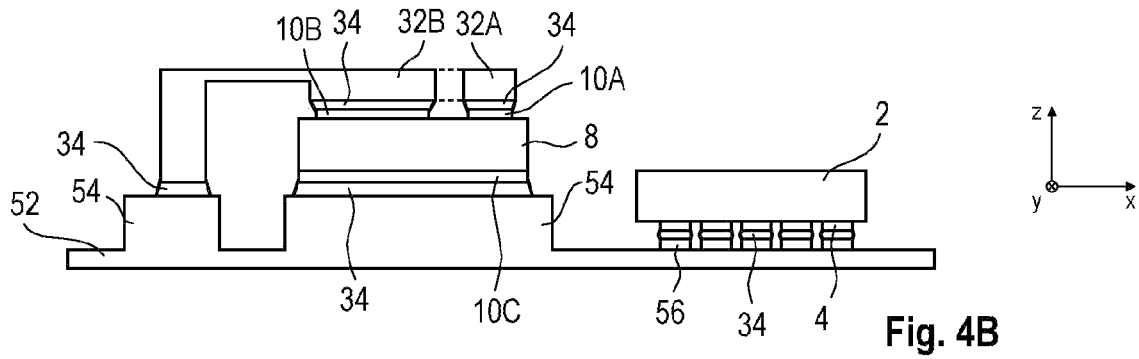
Figure 4C:
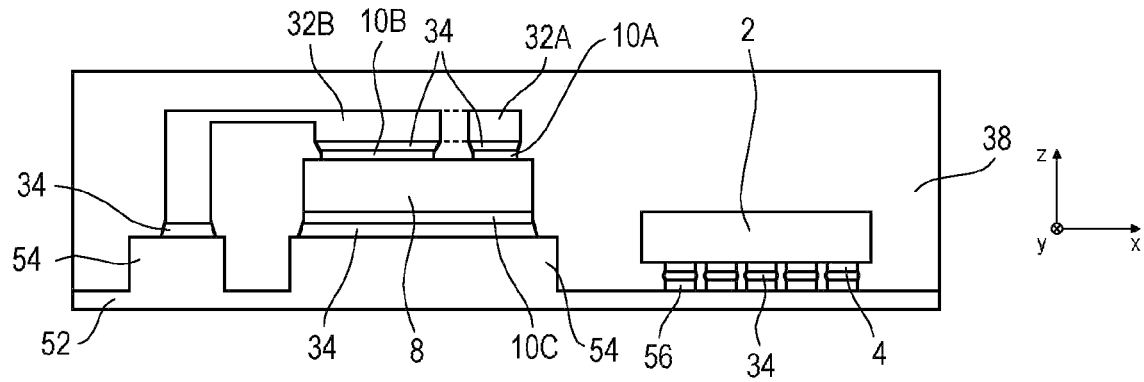
Figure 4D:
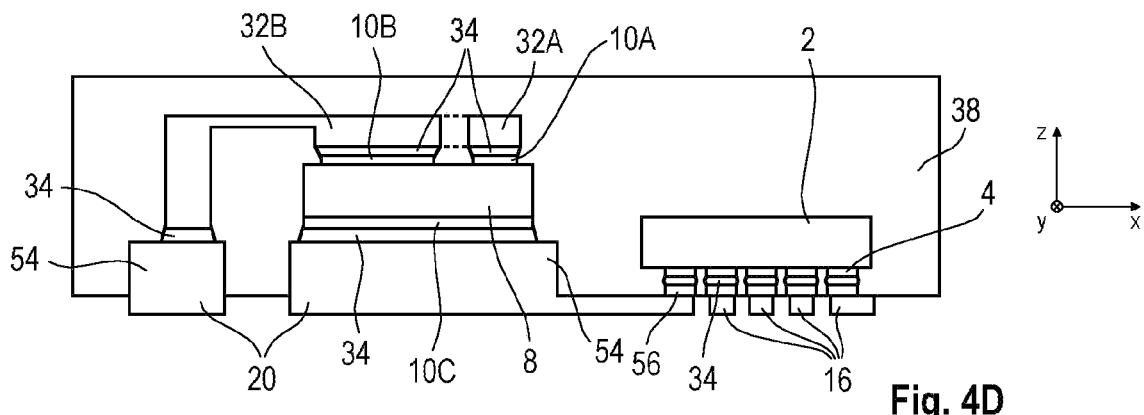
Figure 4E:
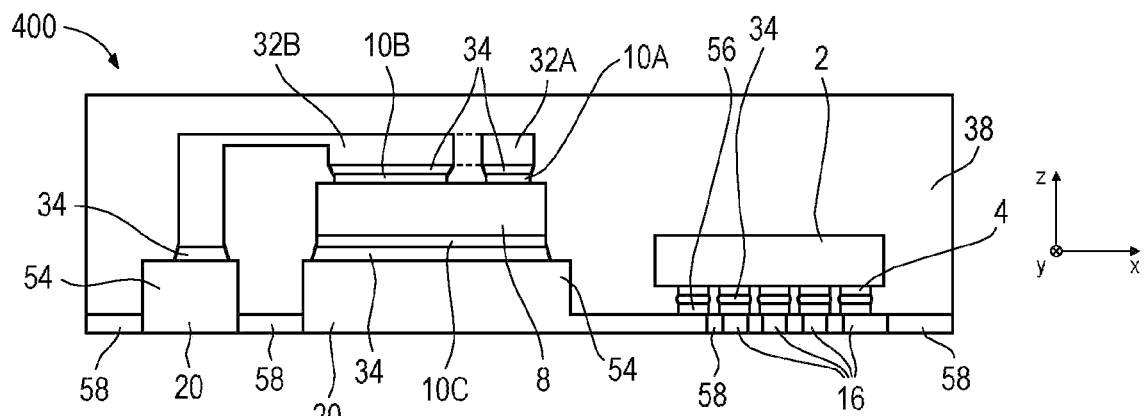

FIG. 4 includes FIGS. 4A to 4E illustrating a method for manufacturing a semiconductor package 400 shown in FIG. 4E. In FIG. 4A, a metal sheet 52 with a thickness $t_3$ may be provided. For example, the metal sheet 52 may be made of at least one of copper or a copper alloy. The upper surface of the metal sheet 52 may be subtractively structured, wherein one or more pedestals 54 with a thickness $t_4$ may be formed. A ratio $t_4/t_3$ may be in a range from about 0.5 to about 0.9, more particular from about 0.6 to about 0.8. For example, the metal sheet 52 may be structured by applying an etching technique which may be based on an MPPL (Multi Purpose Package Line) approach. In addition, one or more landing pads 56 may be formed on the top surface of the structured metal sheet 52. The landing pads 56 may be made of a metal including at least one of copper, nickel, gold, etc. For example, the landing pads 56 may be formed by applying at least one of electroplating, electroless plating, ink jetting, printing, etc.

In FIG. 4B, a non-power chip 2 and a power chip 8 may be arranged on the top surface of the subtractively structured metal sheet 52. Electrical contacts 10A to 10C of the power chip 8 may be electrically connected to the pedestals 54 of the metal sheet 52 via clips 32A, 32B and a connection material 34. The power chip 8, the clips 32A, 32B and the connection material 34 may be similar to like components described in connection with FIG. 3. In addition, electrical contacts 4 of the non-power chip 2 may be mechanically and electrically connected to the landing pads 56 via a connection material 34. For example, this connection may be established based on a flip chip technology and a reflow process.

In FIG. 4C, the non-power chip 2 and the power chip 8 may be encapsulated by an encapsulation material 38. The act of FIG. 4C may be similar to the act of FIG. 3D.

In FIG. 4D, the bottom surface of the metal sheet 52 may be subtractively structured, wherein external electrical contacts 16 and 20 of the semiconductor package to be manufactured may be formed. Since the portions of the metal sheet 52 arranged underneath the non-power chip 2 may have been formed comparatively thin in the act of FIG. 4A, fine pitches, fine lines and fine spaces for an electrical redistribution may be provided.

In FIG. 4E, gaps of the structured bottom surface may be filled with an electrically insulating filler material 58 such that the external electrical contacts 16 and 20 may be electrically insulated from each other.

The method of FIG. 4 may correspond to a batch process. In a further act (not illustrated), the arrangement may be separated into multiple semiconductor packages 400. The semiconductor package 400 of FIG. 4E may be seen as a more detailed version of the semiconductor package 100 of FIG. 1.

The portions of the metal sheet 52, the landing pads 56 and the connection material 34 connected to the non-power chip 2 may form a first electrical redistribution layer. In a similar fashion, the pedestals 54 and the connection material 34 connected to the power chip 8 may form a second electrical redistribution layer. When measured in the z-direction, a maximum thickness of the second electrical redistribution layer may be greater than a maximum thickness of the first electrical redistribution layer.

Figure 5A:
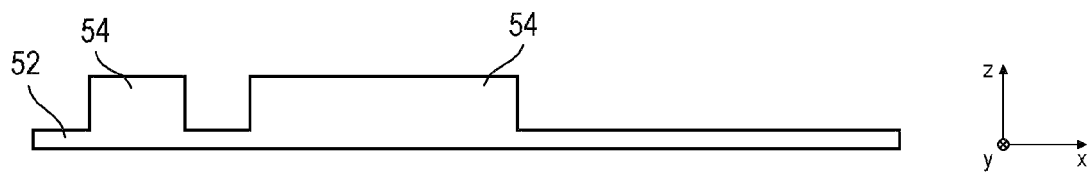
FIG. 5 includes FIGS. 5A to 5E schematically illustrating a cross-sectional side view of a method for manufacturing a semiconductor package 500 in accordance with the disclosure.
Figure 5B:
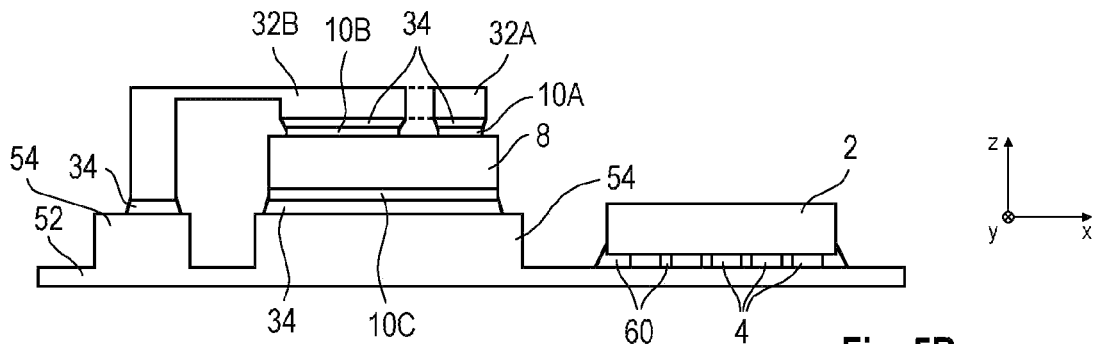
Figure 5C:
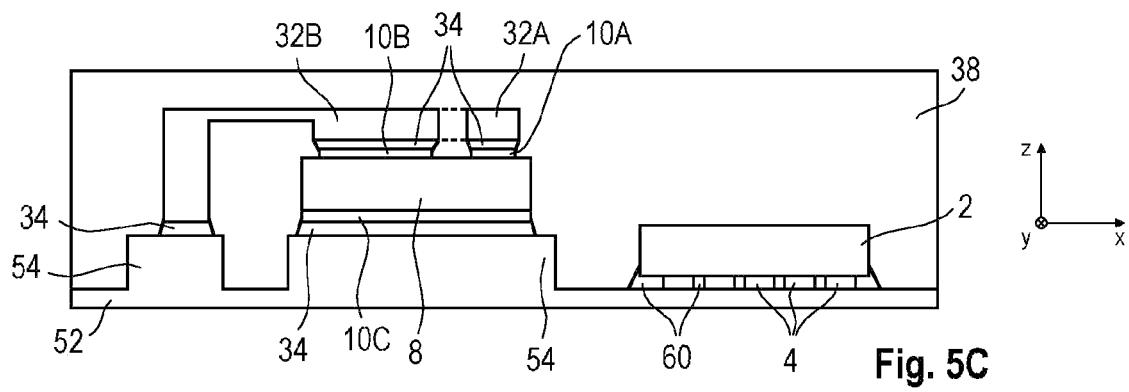
Figure 5D:
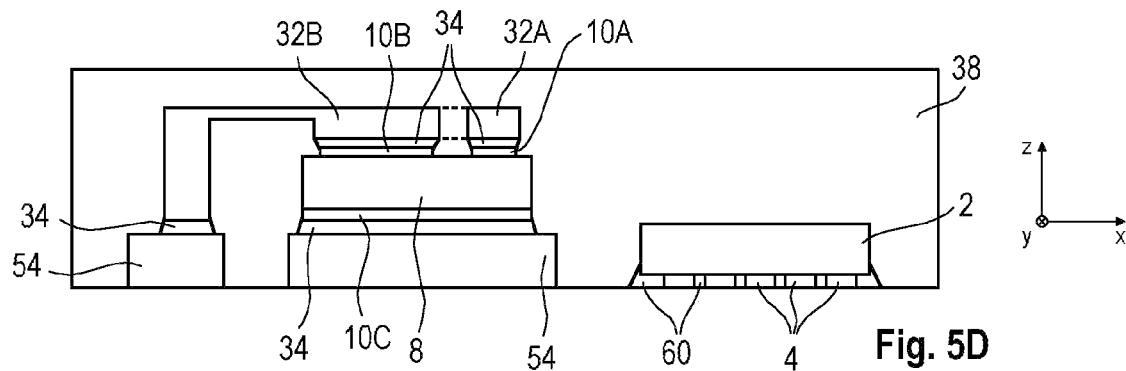
Figure 5E:
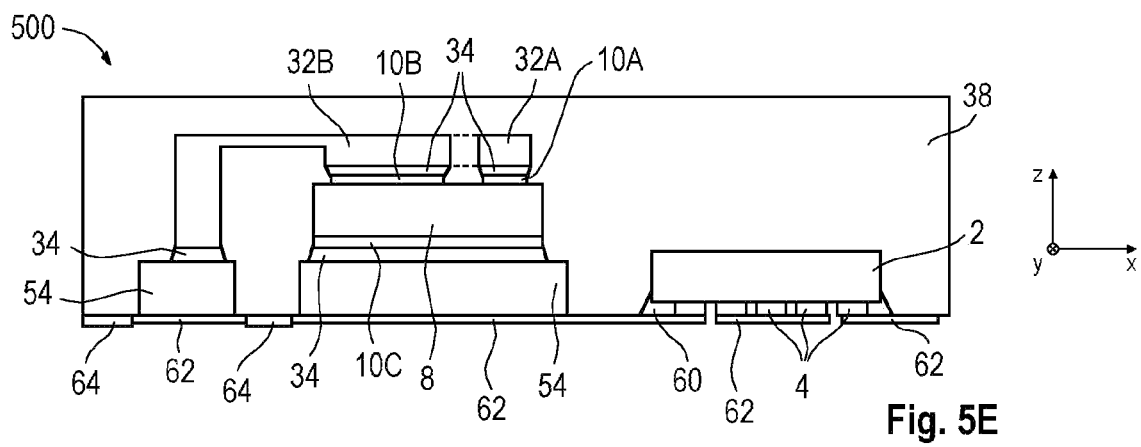

FIG. 5 includes FIGS. 5A to 5E illustrating a method for manufacturing a semiconductor package 500 shown in FIG. 5E. In FIG. 5A, a metal sheet 52 may be subtractively structured. The act of FIG. 5A may be similar to the act of FIG. 4A.

The act of FIG. 5B may be at least partly similar to the act of FIG. 4B. In contrast to FIG. 4B, the non-power chip 2 may be mechanically connected to the top surface of the structured metal sheet 52 by means of a non-conductive glue 60. For example, the electrical contacts 4 of the non-power chip 2 may include at least one of copper pillars or electrically conductive contact pads.

In FIG. 5C, the non-power chip 2 and the power chip 8 may be encapsulated by an encapsulation material 38. The act of FIG. 5C may be similar to the act of FIG. 4C.

In FIG. 5D, material may be removed from the bottom surface of the metal sheet 52. The material may be removed until the pedestals 54 and the electrical contacts 4 of the non-power chip 2 get exposed. For example, removing the backside material of the metal sheet 52 may include at least one of grinding or etching.

In FIG. 5E, an electrical redistribution may be additively formed on the bottom surface of the arrangement by depositing an electrically conductive material 62 and a dielectric material 64. A first portion of the electrically conductive material 62 may be electrically connected to the electrical contacts 4 of the non-power chip 2, and a second portion of the electrically conductive material 62 may be electrically connected to the power chip 8 via the pedestals 54. The dielectric material 64 may be configured to electrically insulate the different portions of the electrically conductive material 62 from each other.

The method of FIG. 5 may correspond to a batch process. In a further act (not illustrated), the arrangement may be separated into multiple semiconductor packages 500. The semiconductor package 500 of FIG. 5E may be seen as a more detailed version of the semiconductor package 100 of FIG. 1. Similar to foregoing examples, the semiconductor package 500 may include two electrical redistribution layers having different thicknesses in the z-direction.

Figure 6A:
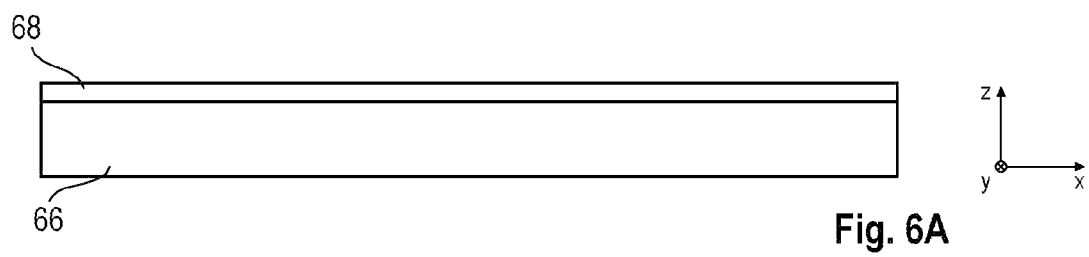
FIG. 6 includes FIGS. 6A to 6F schematically illustrating a cross-sectional side view of a method for manufacturing a semiconductor package 600 in accordance with the disclosure.
Figure 6B:
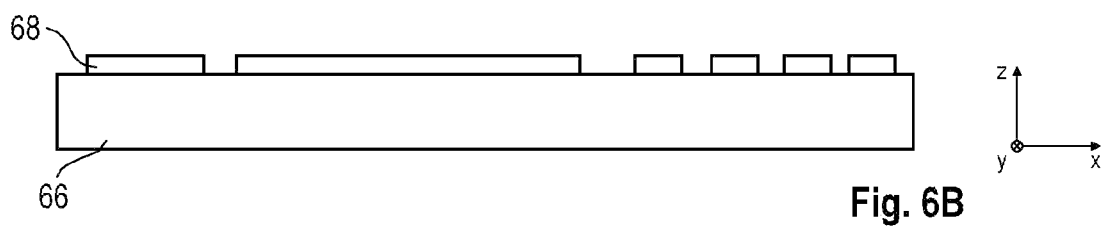
Figure 6C:
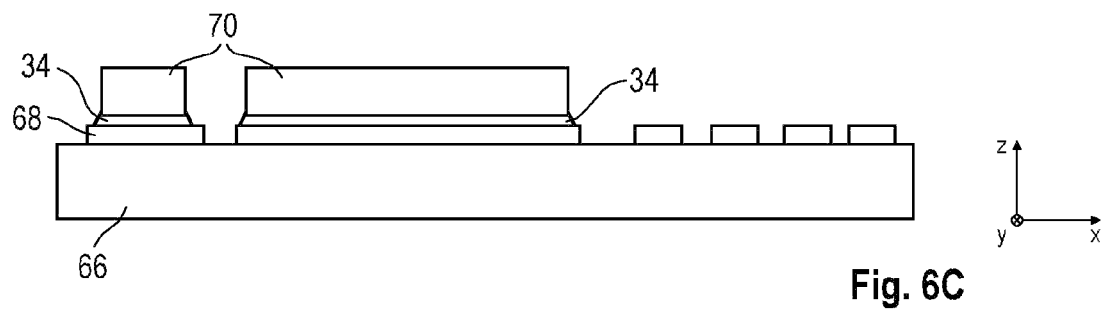
Figure 6D:
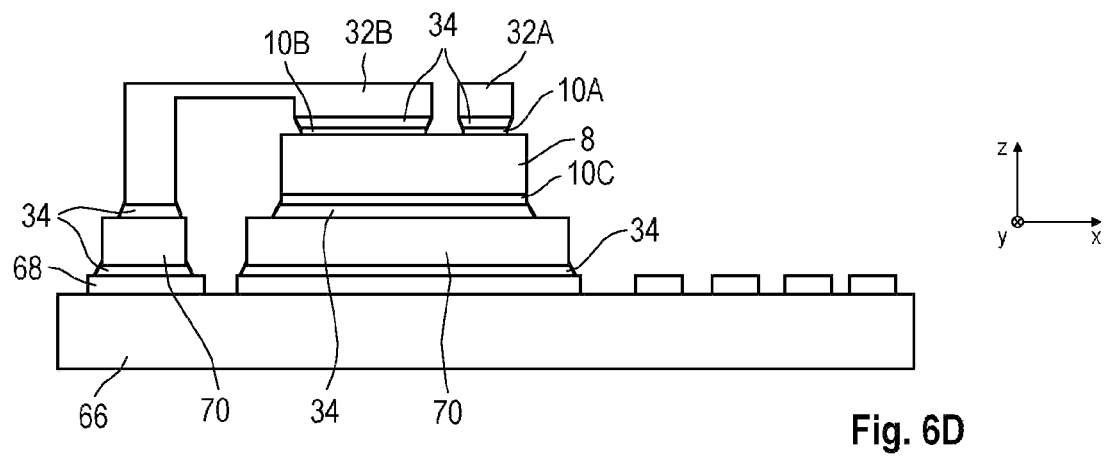
Figure 6E:
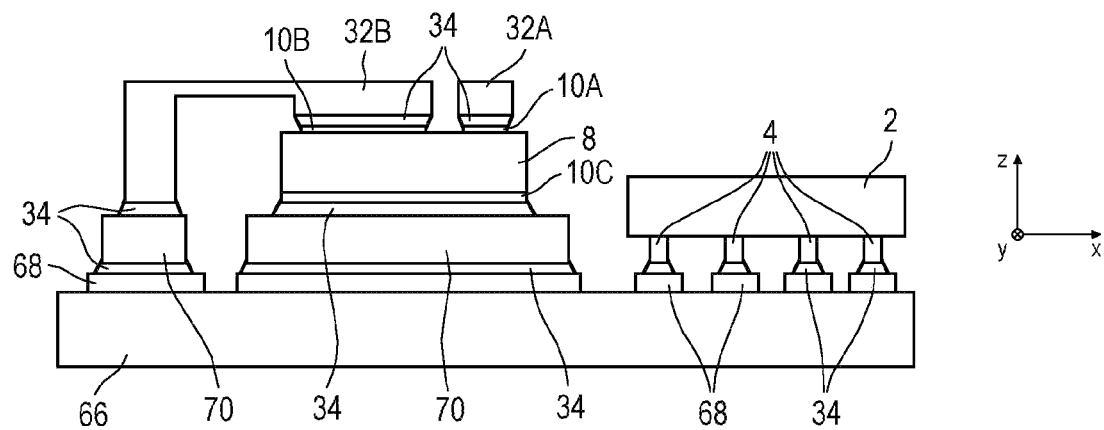
Figure 6F:
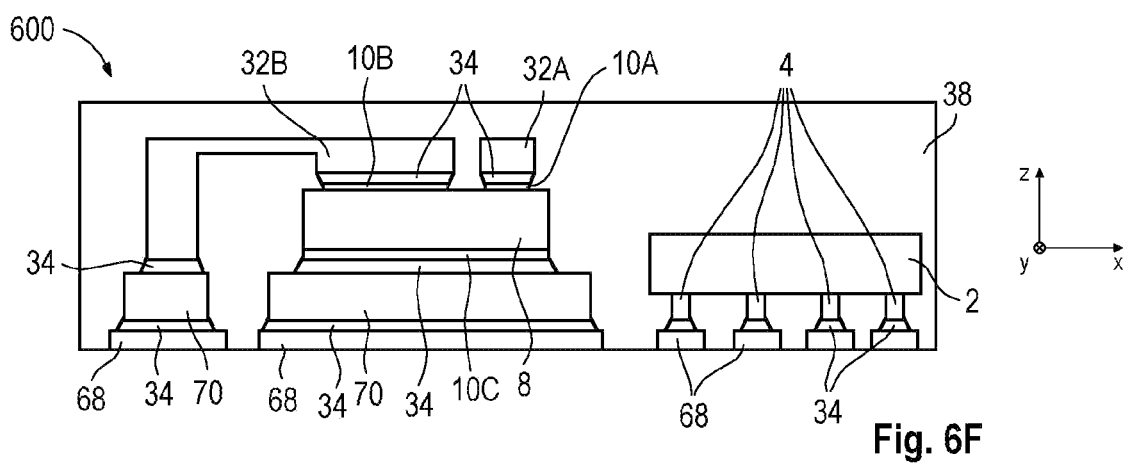

FIG. 6 includes FIGS. 6A to 6F illustrating a method for manufacturing a semiconductor package 600 shown in FIG. 6F. In FIG. 6A, a carrier 66 may be provided. For example, the carrier 66 may be made of at least one of aluminum or a prepreg material. The carrier 66 may include a metal coating 68 arranged over the top surface of the carrier 66. The metal coating 68 may e.g. include at least one of copper or a copper alloy. A thickness of the metal coating 68 in the z-direction may be smaller than about 14 micrometer, more particular smaller than about 12 micrometer, and even more particular smaller than about 10 micrometer.

In FIG. 6B, the metal coating 68 may be subtractively structured, for example by means of an etching process. The remaining portions of the metal coating 68 may be electrically coupled to electrical contacts of a non-power chip and a power chip later on.

In FIG. 6C, electrically conductive posts 70 may be mechanically and electrically connected to one or more portions of the structured metal coating 68 by means of a connection material 34. For example, the electrically conductive posts 70 may be attached based on at least one of soldering, sintering, diffusion soldering, etc. A thickness of the electrically conductive posts 70 in the z-direction may be in a range from about 180 micrometer to about 220 micrometer, more particular from about 190 micrometers to about 210 micrometer.

In FIG. 6D, a power chip 8 may be attached to the top surface of the arrangement. Similar to FIG. 4B, electrical contacts of the power chip 8 may be electrically connected to the electrically conductive posts 70 via clips 32A, 32B and a connection material 34. In the example of FIG. 6D, a gate contact 10A of the power chip 8 may be contacted by a clip 32A. In a further example, the gate contact 10A may be contacted by a bond wire based on a wire bond process.

In FIG. 6E, a non-power chip 2 may be attached to the top surface of the arrangement. Similar to FIG. 4B, multiple electric contacts 4 of the non-power chip 2 may be connected to remaining portions of the structured metal coating 68. In the example of FIG. 6E, the electrical contacts 4 may include at least one of copper pillars or electrically conductive contact pads.

In FIG. 6F, the non-power chip 2 and the power chip 8 may be encapsulated by an encapsulation material 38, for example similar to the act of FIG. 3D. Afterwards, the carrier 66 may be removed. For the case of an aluminum carrier 66, the carrier 66 may be removed by performing an etching process selective to copper. After removing the carrier 66, bottom surfaces of the encapsulation material 38 and the portions of the structured metal coating 68 may form a common planar surface. In a further optional act, a passivation material (not illustrated) may be arranged over the bottom surface of the arrangement.

The method of FIG. 6 may correspond to a batch process. In a further act (not illustrated), the arrangement may be separated into multiple semiconductor packages 600. The semiconductor package 600 of FIG. 6F may be seen as a more detailed version of the semiconductor package 100 of FIG. 1. Similar to foregoing examples the manufactured semiconductor package 600 may include two electrical redistribution layers having different thicknesses in the z-direction.

EXAMPLES

In the following, semiconductor packages and methods for manufacturing semiconductor packages will be explained by means of examples.

Example 1 is a semiconductor package, comprising: a non-power chip comprising a first electrical contact arranged at a first main surface of the non-power chip; a power chip comprising a second electrical contact arranged at a second main surface of the power chip; a first electrical redistribution layer, wherein the first electrical redistribution layer is configured to provide an electrical coupling between the first electrical contact and a first external electrical contact of the semiconductor package; and a second electrical redistribution layer, wherein the second electrical redistribution layer is configured to provide an electrical coupling between the second electrical contact and a second external electrical contact of the semiconductor package, wherein, when measured in a first direction vertical to at least one of the first main surface or the second main surface, a maximum thickness of at least a section of the first electrical redistribution layer is smaller than a maximum thickness of the second electrical redistribution layer.

Example 2 is a semiconductor package according to Example 1, wherein, when viewed in the first direction, the section of the first electrical redistribution layer is arranged in a footprint of the non-power chip.

Example 3 is a semiconductor package according to Example 1 or 2, wherein the maximum thickness of the first electrical redistribution layer is in a range from 2 micrometer to 40 micrometer.

Example 4 is a semiconductor package according to one of the preceding Examples, wherein the maximum thickness of the second electrical redistribution layer is in a range from 150 micrometer to 2000 micrometer.

Example 5 is a semiconductor package according to one of the preceding Examples, wherein the non-power chip comprises at least one of a logic chip, a memory chip, a sensor chip.

Example 6 is a semiconductor package according to one of the preceding Examples, wherein the first external electrical contact and the second external electrical contact are arranged at a same peripheral surface of the semiconductor package.

Example 7 is a semiconductor package according to one of the preceding Examples, wherein: at least the section of the first electrical redistribution layer is configured to carry electrical currents in a second direction parallel to the first main surface of the non-power chip, and the second electrical redistribution layer is configured to carry electrical currents in the first direction.

Example 8 is a semiconductor package according to one of the preceding Examples, wherein: an operation of the non-power chip is based on a horizontal current flow, and an operation of the power chip is based on a vertical current flow.

Example 9 is a semiconductor package according to one of the preceding Examples, further comprising: an encapsulation material, wherein the non-power chip and the power chip are both encapsulated in the same encapsulation material.

Example 10 is a method for manufacturing a semiconductor package, wherein the method comprises: providing a non-power chip comprising a first electrical contact arranged at a first main surface of the non-power chip; providing a power chip comprising a second electrical contact arranged at a second main surface of the power chip; forming a first electrical redistribution layer, wherein the first electrical redistribution layer is configured to provide an electrical coupling between the first electrical contact and a first external electrical contact of the semiconductor package; and forming a second electrical redistribution layer, wherein the second electrical redistribution layer is configured to provide an electrical coupling between the second electrical contact and a second external electrical contact of the semiconductor package, wherein, when measured in a first direction vertical to at least one of the first main surface or the second main surface, a maximum thickness of at least a section of the first electrical redistribution layer is smaller than a maximum thickness of the second electrical redistribution layer.

Example 11 is a method according to Example 10, wherein providing the non-power chip and providing the power chip comprises: providing a carrier; arranging the non-power chip and the power chip over the carrier; encapsulating the non-power chip and the power chip in an encapsulation material; and removing the carrier, wherein the first main surface, the second main surface and a main surface of the encapsulation material form a common planar surface.

Example 12 is a method according to Example 11, wherein forming the first electrical redistribution layer and forming the second electrical redistribution layer comprises: arranging at least one first metal layer over the common planar surface, wherein the at least one first metal layer is electrically coupled to the first electrical contact; and arranging at least one second metal layer over the planar common surface, wherein the at least one second metal layer is electrically coupled to the second electrical contact, wherein the at least one first metal layer and the at least second metal layer are simultaneously arranged in a same method act.

Example 13 is a method according to Example 12, wherein forming the first electrical redistribution layer and forming the second electrical redistribution layer further comprises: electrically coupling a leadframe to the at least one first metal layer and to the at least one second metal layer.

Example 14 is a method according to Example 10, further comprising: providing a metal sheet having a first main surface and a second main surface opposite to the first main surface, wherein forming the second electrical redistribution layer comprises subtractively structuring the first main surface of the metal sheet.

Example 15 is a method according to Example 14, wherein subtractively structuring the first main surface of the metal sheet comprises etching the first main surface of the metal sheet.

Example 16 is a method according to Example 14 or 15, further comprising: attaching the non-power chip and the power chip to the subtractively structured first main surface of the metal sheet, wherein forming the first electrical redistribution layer comprises subtractively structuring the second main surface of the metal sheet after attaching the non-power chip and the power chip.

Example 17 is a method according to Example 14 or 15, further comprising: attaching the non-power chip and the power chip to the structured first main surface of the metal sheet; and removing material from the second main surface of the metal sheet, wherein forming the first electrical redistribution layer comprises additively forming the first electrical redistribution layer over the second main surface of the metal sheet after removing the material.

Example 18 is a method according to Example 17, wherein removing the material comprises at least one of grinding or etching the second main surface.

Example 19 is a method according to Example 10, further comprising: providing a carrier comprising a metal coating, wherein forming the first electrical redistribution layer and the second electrical redistribution layer comprises subtractively structuring the metal coating.

Example 20 is a method according to Example 19, wherein at least one of: the carrier comprises at least one of aluminum or a prepreg material, or the metal coating comprises copper.

Example 21 is a method according to Example 19 or 20, wherein forming the second electrical redistribution layer comprises arranging electrically conductive posts over the subtractively structured metal coating.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

What is claimed is:

1. A semiconductor package, comprising:
a non-power chip comprising a first electrical contact arranged at a first main surface of the non-power chip;
a power chip comprising a second electrical contact arranged at a second main surface of the power chip;
a first electrical redistribution layer, wherein the first electrical redistribution layer is configured to provide an electrical coupling between the first electrical contact and a first external electrical contact of the semiconductor package; and
a second electrical redistribution layer, wherein the second electrical redistribution layer is configured to provide an electrical coupling between the second electrical contact and a second external electrical contact of the semiconductor package,
wherein the second electrical redistribution layer comprises one of: a lead of a leadframe, a pedestal of a structured metal sheet, a conductive post,
wherein, when measured in a first direction vertical to at least one of the first main surface or the second main surface, a maximum thickness of at least a section of the first electrical redistribution layer is smaller than a maximum thickness of the second electrical redistribution layer, and
wherein the second main surface faces the second external electrical contact.

2. The semiconductor package of claim 1, wherein, when viewed in the first direction, the section of the first electrical redistribution layer is arranged in a footprint of the non-power chip.

3. The semiconductor package of claim 1, wherein the maximum thickness of the first electrical redistribution layer is in a range from 2 micrometer to 40 micrometer.

4. The semiconductor package of claim 1, wherein the maximum thickness of the second electrical redistribution layer is in a range from 150 micrometer to 2000 micrometer.

5. The semiconductor package of claim 1, wherein the non-power chip comprises at least one of a logic chip, a memory chip, a sensor chip.

6. The semiconductor package of claim 1, wherein the first external electrical contact and the second external electrical contact are arranged at a same peripheral surface of the semiconductor package.

7. The semiconductor package of claim 1, wherein:
- at least the section of the first electrical redistribution layer is configured to carry electrical currents in a second direction parallel to the first main surface of the non-power chip, and
- the second electrical redistribution layer is configured to carry electrical currents in the first direction.

8. The semiconductor package of claim 1, wherein:
- an operation of the non-power chip is based on a horizontal current flow, and
- an operation of the power chip is based on a vertical current flow.

9. The semiconductor package of claim 1, further comprising:
- an encapsulation material, wherein the non-power chip and the power chip are both encapsulated in the same encapsulation material.

* * * * *